United States Patent
Ivankovic (10) Patent No.: US 8,653,881 B2
(45) Date of Patent: Feb. 18, 2014

(54) HALF BRIDGE FLYBACK AND FORWARD

(75) Inventor: Mladen Ivankovic, Oakville (CA)

(73) Assignee: Infineon Technologies Austria AG, Villach (AT)

( * ) Notice: Subject to any disclaimer, the term of this patent is extended or adjusted under 35 U.S.C. 154(b) by 21 days.

(21) Appl. No.: 13/436,109

(22) Filed: Mar. 30, 2012

(65) Prior Publication Data

US 2013/0194026 A1  Aug. 1, 2013

Related U.S. Application Data

(63) Continuation-in-part of application No. 13/362,100, filed on Jan. 31, 2012.

(51) Int. Cl.
*H03K 17/687* (2006.01)
(52) U.S. Cl.
USPC ........................................... 327/430; 327/427
(58) Field of Classification Search
USPC ..................................... 327/419, 427–434
See application file for complete search history.

(56) References Cited

U.S. PATENT DOCUMENTS

| | | | |
|---|---|---|---|
| 6,285,235 B1 | 9/2001 | Ichikawa et al. | |
| 8,222,928 B2 * | 7/2012 | Bayerer | 327/108 |
| 2005/0012541 A1 * | 1/2005 | Watanabe | 327/419 |
| 2009/0140791 A1 * | 6/2009 | Young | 327/419 |
| 2009/0316441 A1 * | 12/2009 | Hu | 363/21.06 |
| 2010/0134179 A1 | 6/2010 | Bayerer | |
| 2010/0327947 A1 * | 12/2010 | Havanur | 327/434 |
| 2012/0044014 A1 | 2/2012 | Stratakos et al. | |
| 2012/0139589 A1 * | 6/2012 | Machida et al. | 327/109 |
| 2013/0127017 A1 * | 5/2013 | Seok | 257/577 |

* cited by examiner

*Primary Examiner* — Lincoln Donovan
*Assistant Examiner* — Diana J Cheng
(74) *Attorney, Agent, or Firm* — Murphy, Bilak & Homiller, PLLC (57) ABSTRACT

A circuit includes a high-side switch, a low-side switch, a diode, a transformer having a primary winding and a secondary windowing, and an input connected to a first terminal of the primary winding. The high-side switch has a source, a gate connected to a drive source and a drain connected to a second terminal of the primary winding. The low-side switch has a source connected to ground, a gate connected to a drive source and a drain connected to the source of the high-side switch. The diode is connected between the gate of the high-side switch and the first terminal of the primary winding. The diode forms a current loop with the primary winding and the high-side switch to circulate current when low side switch is off until the high side switch turns off.

21 Claims, 13 Drawing Sheets

HALF BRIDGE FLYBACK AND FORWARD

PRIORITY CLAIM

The present application is a continuation-in-part of previously-filed U.S. patent application Ser. No. 13/362,100 filed on Jan. 31, 2012, and herein incorporated by reference in its entirety.

TECHNICAL FIELD

The present application relates to switches, in particular cascode switches.

BACKGROUND

Cascode switches are typically designed with two or more MOSFETs (metal oxide semiconductor field effect transistors) or IGBTs (insulated gate bipolar transistors) connected in series. For example in a two transistor cascode switch, one transistor is coupled to the load and the second transistor is coupled in series between the first transistor and ground. The transistors are switched on and off in order to switch the load current as demanded or required. The load voltage is distributed across all of the series connected power transistors included in the cascode switch. For example, two 800V rated MOSFETs may be connected in series for switching a 1000V or greater load.

A prevalent issue with cascode switches is how to drive the high-side MOSFET or IGBT i.e. the transistor coupled closest to the load. In conventional approaches, a high voltage source such as a Zener diode in series with a resistor is used to turn on the high-side transistor, and the load current flowing through the high-side transistor is used to passively turn off the transistor. The low-side transistor i.e. the transistor coupled closest to ground is switched on and off with a pulsed low voltage source. The disadvantage of this approach is that the passive turn off of the high-side transistor is highly dependent on load current, and during turn off of the high-side transistor there is high dissipation on the low-side transistor voltage limiter.

SUMMARY

Disclosed herein are embodiments in which a low voltage source is used to turn on a high-side transistor of a cascode switch. Other embodiments described herein use a local driver stage to actively turn off the high-side transistor of the cascode switch independent of load current. Various ones of these embodiments may be combined with each other as described herein to yield a cascode switch in which a low voltage source is used to turn on the high-side transistor of the switch and the high-side transistor is actively turned off independent of load current. Further embodiments described herein provide for recovery of a portion of the turn off energy used to turn off of the high-side transistor, avalanche protection and lossless switching.

According to an embodiment of a circuit, the circuit includes a high-side switch, a low-side switch, a diode, a transformer having a primary winding and a secondary windowing, and an input connected to a first terminal of the primary winding. The high-side switch has a source, a gate connected to a drive source and a drain connected to a second terminal of the primary winding. The low-side switch has a source connected to ground, a gate connected to a drive source and a drain connected to the source of the high-side switch. The diode is connected between the gate of the high-side switch and the first terminal of the primary winding. The diode forms a current loop with the primary winding and the high-side switch to circulate current when low side switch is off until the high side switch turns off.

According to an embodiment of a method of switching a load, the method includes: driving an input connected to a first terminal of a primary winding of a transformer, the transformer having a secondary winding connected to the load; switching on and off a low-side switch having a drain, a source connected to ground, a gate connected to a drive source; switching on and off a high-side switch having a drain connected to a second terminal of the primary winding, a source connected to the drain of the low-side switch and a gate connected to a drive source; and circulating current in a loop formed by the primary winding, the high-side switch and a diode connected between the gate of the high-side switch and the first terminal of the primary winding when the low-side switch is turned off and the high-side switch is turning off.

According to another embodiment of a circuit, the circuit includes a transformer having a primary winding and a secondary winding, an input connected to a first terminal of the primary winding, a high-side switch having a source, a gate connected to a drive source and a drain connected to a second terminal of the primary winding, and a low-side switch having a source connected to ground, a gate connected to a drive source and a drain connected to the source of the high-side switch. A diode is connected between the gate of the high-side switch and the first terminal of the primary winding. The diode is operable to circulate current in a loop with the primary winding and the high-side switch during turning off of the high-side switch and transfer the current to the secondary winding via a magnetic field in the transformer when the primary winding is disconnected after the high-side switch is turned off.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
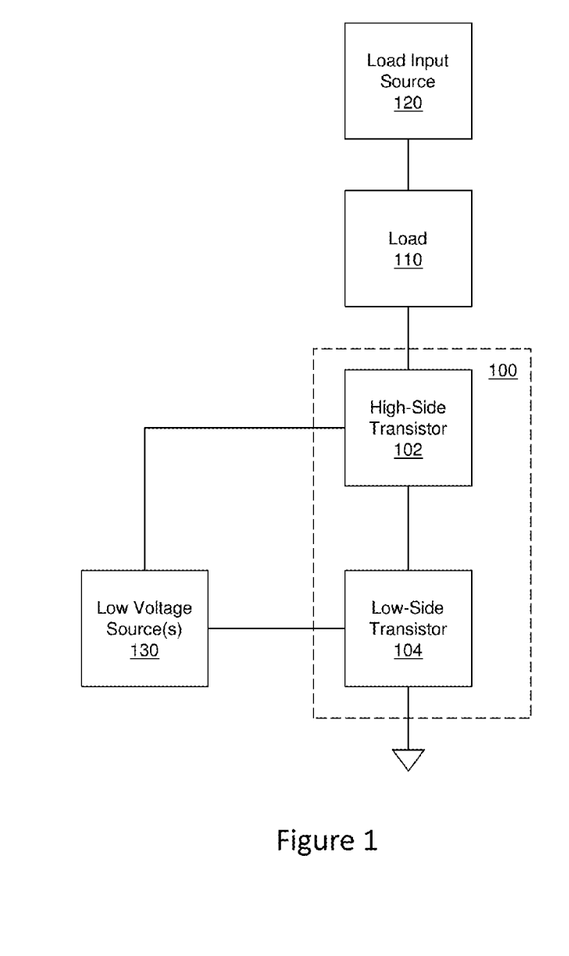
FIG. 1 illustrates a block diagram of a circuit including a load and a cascode switch coupled to the load, the cascode switch having a high-side power transistor with a low voltage source input.

FIG. 1 illustrates an embodiment of a cascode switch 100 coupled to a load 110. The load 110 is also connected to an input source 120. The cascode switch 100 switches the load current, and includes a first power transistor 102 coupled to the load 110 and a second power transistor 104 coupled in series with the first power transistor 102 so that the second power transistor 104 is between ground and the first power transistor 102. In one embodiment, the cascoded transistors 102, 104 are power MOSFETs. In another embodiment, the cascoded transistors 102, 104 are IGBTs. In each case, the second power transistor 104 (also referred to herein as the low-side transistor or switch) switches on and off responsive to a pulse low voltage source 130 coupled to the gate of the low-side transistor 104.

The first power transistor 102 (also referred to herein as the high-side transistor or switch) switches on and off responsive to the same pulse source as the second power transistor or a DC source 130 coupled to the gate of the high-side transistor 102. In the first case, both transistors 102, 104 of the cascode switch 100 are driven from the same pulse source e.g. as provided by a control circuit. In the second case, the low-side transistor 104 is driven from the pulse source and the high-side transistor 102 is driven from a DC supply voltage e.g. also provided by the control circuit. The second scenario where the high-side transistor 102 is driven from a DC supply voltage may be more favorable for high voltage applications e.g. 1000V and above. In either case, a high voltage source is not used to switch on the high-side transistor 102 according to this embodiment. Instead, low voltage turn on drive is used for both the high-side and low-side transistors 102, 104 of the cascode switch 100.

Figure 2:
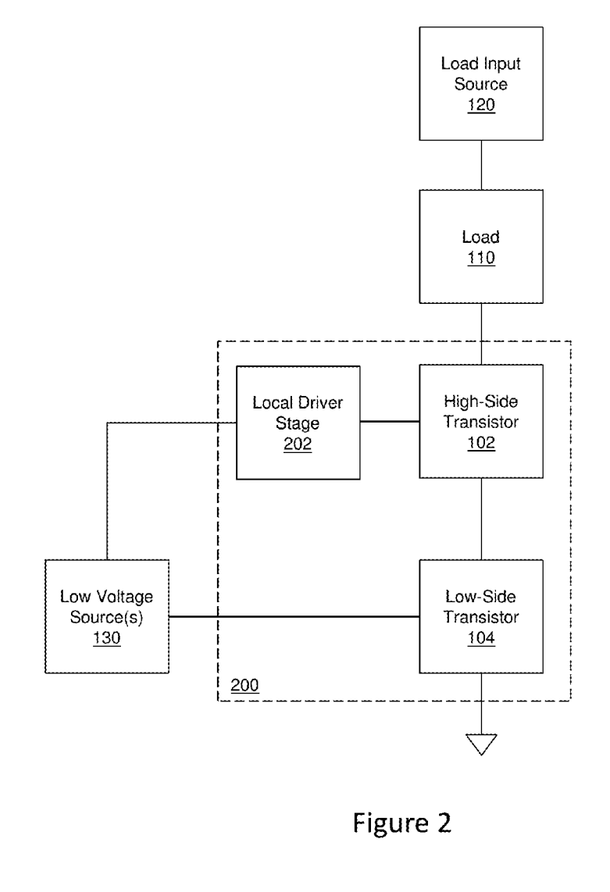
FIG. 2 illustrates a block diagram of a circuit including a load, a cascode switch coupled to the load and a device for actively turning off a high-side transistor of the cascode switch independent of load current.

FIG. 2 illustrates another embodiment of a cascode switch 200 coupled to a load 110. The cascode switch 200 has the same series arrangement of power transistors 102, 104 as in FIG. 1, however the high-side transistor 102 is coupled to a local driver stage 202 which actively turns off the high-side transistor 102 independent of load current. The high-side and low-side power transistors 102, 104 can each have a low voltage input source 130 as described above with reference to FIG. 1, or alternatively the high-side transistor 102 instead may have a high voltage input source. The high-side transistor 102 is actively switched off independent of load current via the local driver stage 202. The embodiments illustrated in FIGS. 1 and 2 may be combined to yield a cascode switch in which a low voltage source is used to turn on the high-side transistor 102 and the high-side transistor 102 is also actively turned off independent of load current.

Figure 3:
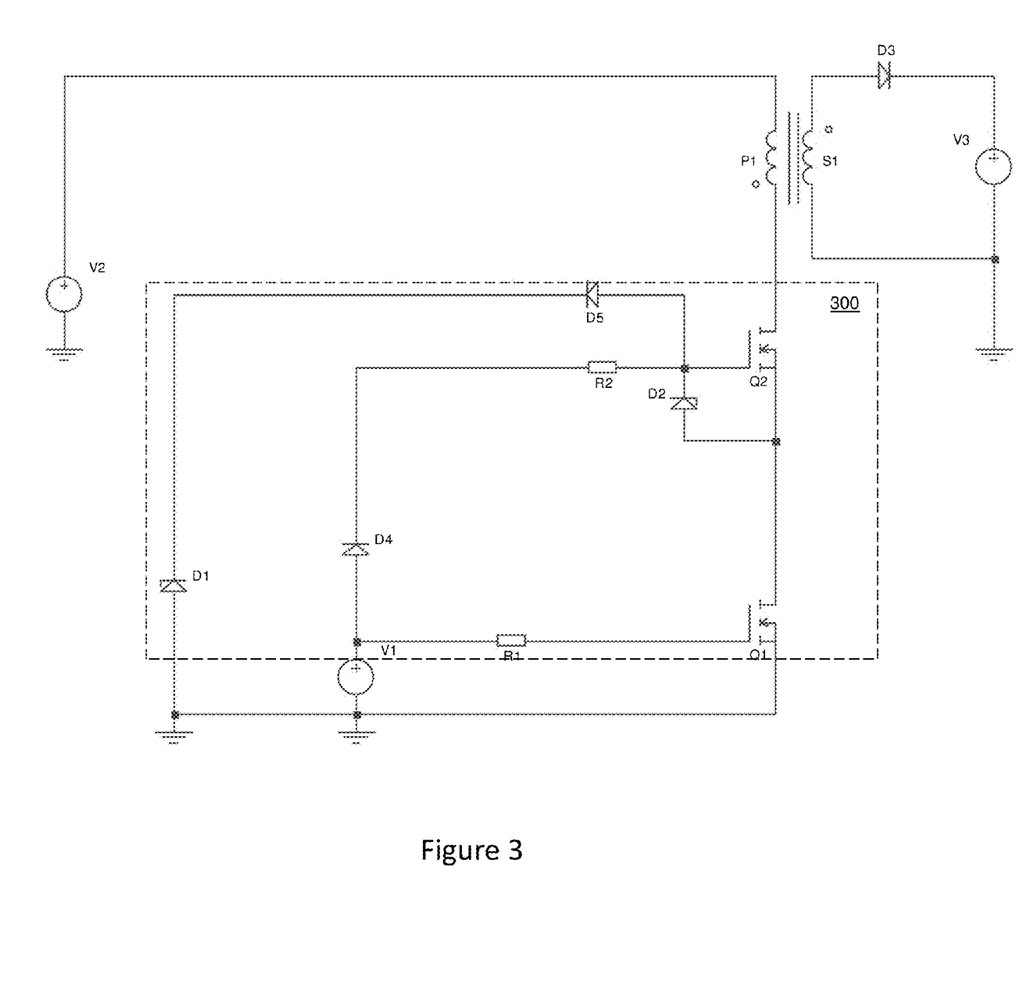
FIG. 3 illustrates a block diagram of a circuit including a load and a cascode switch coupled to the load, the cascode switch having a high-side power transistor and a low-side power transistor coupled to the same low voltage source input.

FIG. 3 illustrates an embodiment of a cascode switch 300 coupled to a load. The load is transformer according to this embodiment, having a primary winding (P1) and a secondary winding (S1). The primary winding P1 is connected to an input source V2 and the secondary winding S1 is connected to a load represented by voltage V3 via a rectifier diode D3. The cascode switch 300 includes a high-side MOSFET Q2 coupled to the primary winding P1 and a low-side MOSFET Q1 coupled in series between ground and the high-side MOSFET Q1. According to this embodiment, the gate of the low-side MOSFET Q1 is coupled to a pulse low voltage source V1 via a resistor R1. The gate of the high-side MOSFET Q2 is coupled to the same pulse low voltage source V1 as the low-side MOSFET Q1, via a resistor R2 and a rectifier diode D4. The cathode of rectifier diode D4 is connected to resistor R2 and the anode is connected to pulse source V1. Power transistors Q1 and Q2 of the cascode switch 300 are driven from the same low voltage pulse source V1 according to this embodiment.

The cascode switch 300 shown in FIG. 3 further includes a diode D2 which functions as a voltage limiter for maintaining the gate-to-source voltage (Vgs) of the high-side MOSFET Q2 below a safe level e.g. 20V. Usually the amplitude of the pulse low voltage source V1 is lower than this safe level (20V in this example) and therefore voltage limiter diode D2 is provided as a safety measure. The gate of the high-side MOSFET Q2 is also coupled to the anode of rectifier diode D5, the cathode of which is connected to the cathode of transient voltage suppression (TVS) diode D1. The anode of TVS diode D1 is connected to ground. TVS diode D1 functions as a high voltage Zener diode.

During turn on of the cascode switch 300, pulse source V1 turns on low-side MOSFET Q1 and rectifier diode D4 begins to conduct. In the conducting state rectifier diode D4 charges the input capacitance of high-side MOSFET Q2 through resistor R2, turning on high-side MOSFET Q2.

During turn off of the cascode switch 300, pulse source V1 turns off low-side MOSFET Q1 which in turn causes the drain-to-source voltage (Vds) of Q1 to begin rising. When Vds of MOSFET Q1 reaches a threshold voltage of TVS diode D1, rectifier diode D5 begins to conduct and load current shifts from the low-side MOSFET Q1 to TVS diode D1. Load current goes through the gate-to-source capacitor Cgs of the high-side MOSFET Q2, discharging Cgs. The high-side MOSFET Q2 turns off when Cgs is discharged. As such, turn off of the high-side MOSFET Q2 depends on the load current according to this embodiment. When Vgs reaches −Vf (forward voltage) of voltage limiter diode D2, current shifts from Cgs to diode D2. Current flows through voltage limiter diode D2 until the high-side MOSFET Q2 completely turns off.

Figure 4:
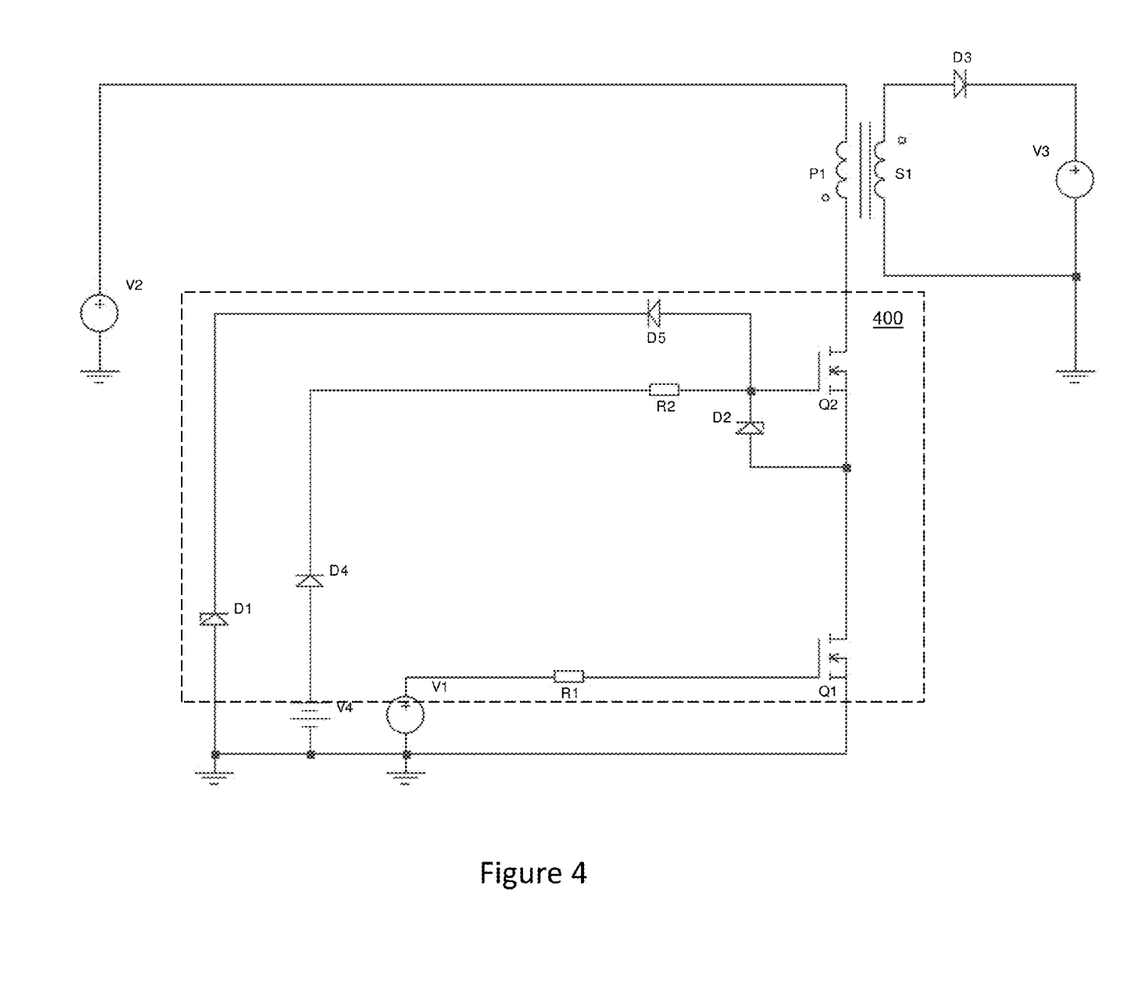
FIG. 4 illustrates a block diagram of a circuit including a load and a cascode switch coupled to the load, the cascode switch having a high-side power transistor and a low-side power transistor coupled to different low voltage source inputs.

FIG. 4 illustrates an embodiment of a cascode switch 400 which is similar to the embodiment shown in FIG. 3, however the low-side MOSFET Q2 is driven from the pulse source V1 and high-side MOSFET Q1 is driven from a DC source V4. The embodiment shown in FIG. 4 may be more favorable for high voltage applications e.g. 1000V and above.

Described next are additional embodiments of a cascode switch. For ease of illustration, the high-side and low-side transistors of the cascode switch are shown connected to the same low voltage pulse source in each of these embodiments.

However, the high-side and low-side transistors can be connected to different input sources as described above.

Figure 5:
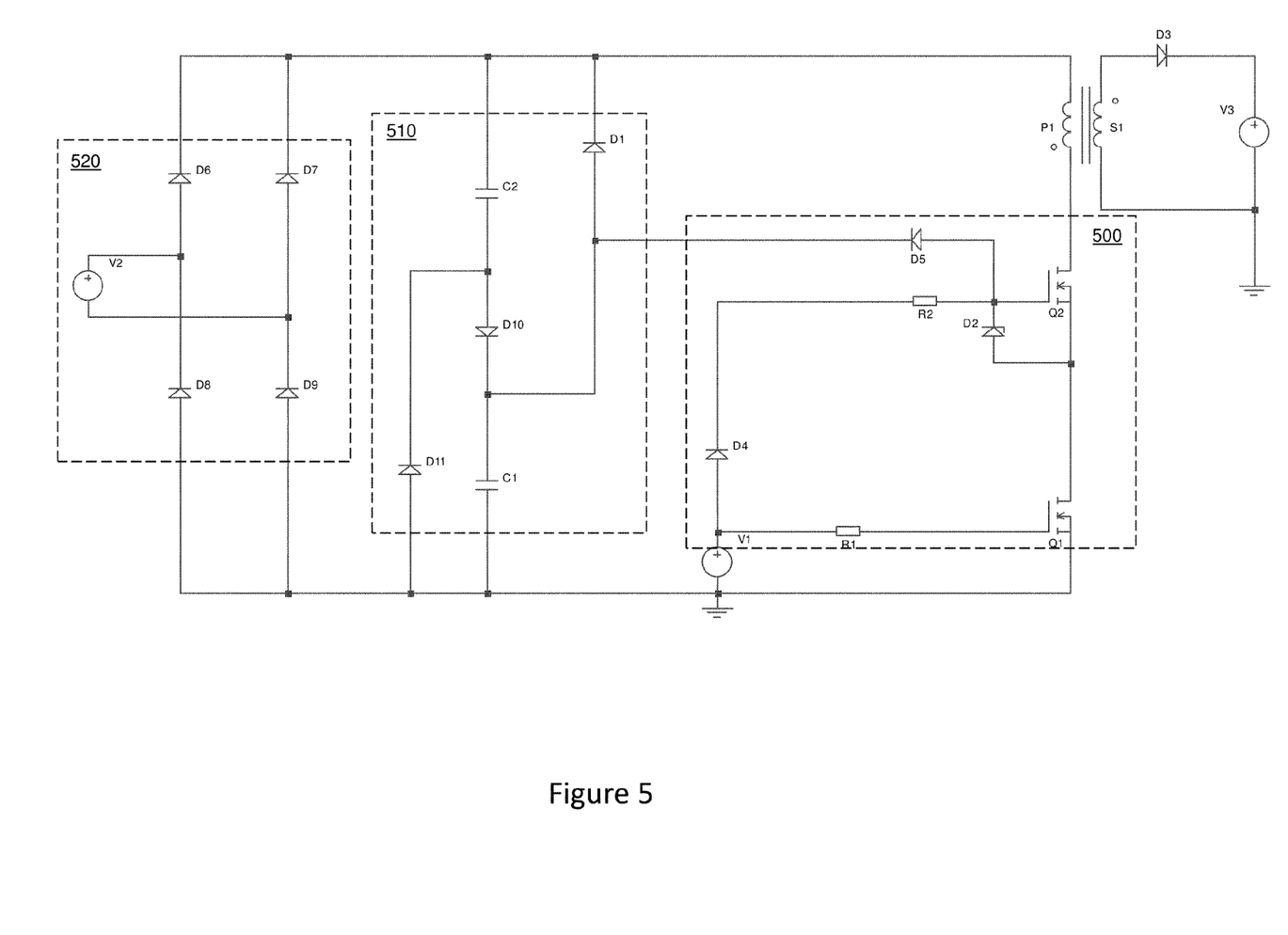
FIG. 5 illustrates a block diagram of a circuit including a load, a cascode switch coupled to the load and an energy recovery device.

FIG. 5 illustrates an embodiment of a cascode switch 500 which is similar to the embodiment shown in FIG. 3, however the cathode of rectifier diode D5 is coupled to an energy recovery circuit 510 instead of a TVS diode. The energy recovery circuit 510 includes capacitors C1 and C2, and rectifier diodes D1, D10 and D11. The energy recovery circuit 510 stores energy from the load during switching off of the cascode power transistors Q1 and Q2, and reuses the stored energy to power the load during a subsequent switching cycle of the power transistors Q1 and Q2. The circuit shown in FIG. 5 also has a full wave rectifier 520 including diodes D6, D7, D8 and D9 for rectifying AC input source V2 toward the load.

During turn on of the cascode switch 500, pulse source V1 turns on the low-side MOSFET Q1 and rectifier diode D4 begins to conduct, charging the input capacitance of the high-side MOSFET Q2 through resistor R2. The high-side MOSFET Q2 turns on in response. Voltage limiter diode D2 maintains Vgs of the high-side MOSFET Q2 below a safe level as previously described herein.

During turn off of the cascode switch 500, pulse source V1 turns off the low-side MOSFET Q1 and Vds of Q1 correspondingly begins to rise. When Vds of the low-side MOSFET Q1 reaches half of the bus voltage (i.e. half of the voltage across C1, D10, C2 or in other words the rectified input voltage), rectifier diode D5 begins to conduct and load current shifts from the low-side MOSFET Q1 to the input capacitor C1 of the energy recovery circuit 510. Load current also goes through Cgs of the high-side MOSFET Q2. When Cgs of the high-side MOSFET Q2 is discharged responsive to the load current, the high-side MOSFET Q2 turns off. When Vgs of the high-side MOSFET Q2 reaches −Vf of the voltage limiter diode D2, current shifts from Cgs to the voltage limiter diode D2. Current flows through diode D2 until the high-side MOSFET Q2 completely turns off. Instead of dissipating energy on a TVS diode as is done with the embodiments illustrated in FIGS. 3 and 4, the energy is contained in capacitor C1 of the energy recovery circuit 510 and reused in the next switching cycle of the cascode switch 500 to improve efficiency. Diodes D1, D10, D11 together with capacitors C1 and C2 form a passive factor correction circuit which recovers part of the switching energy.

Figure 6:
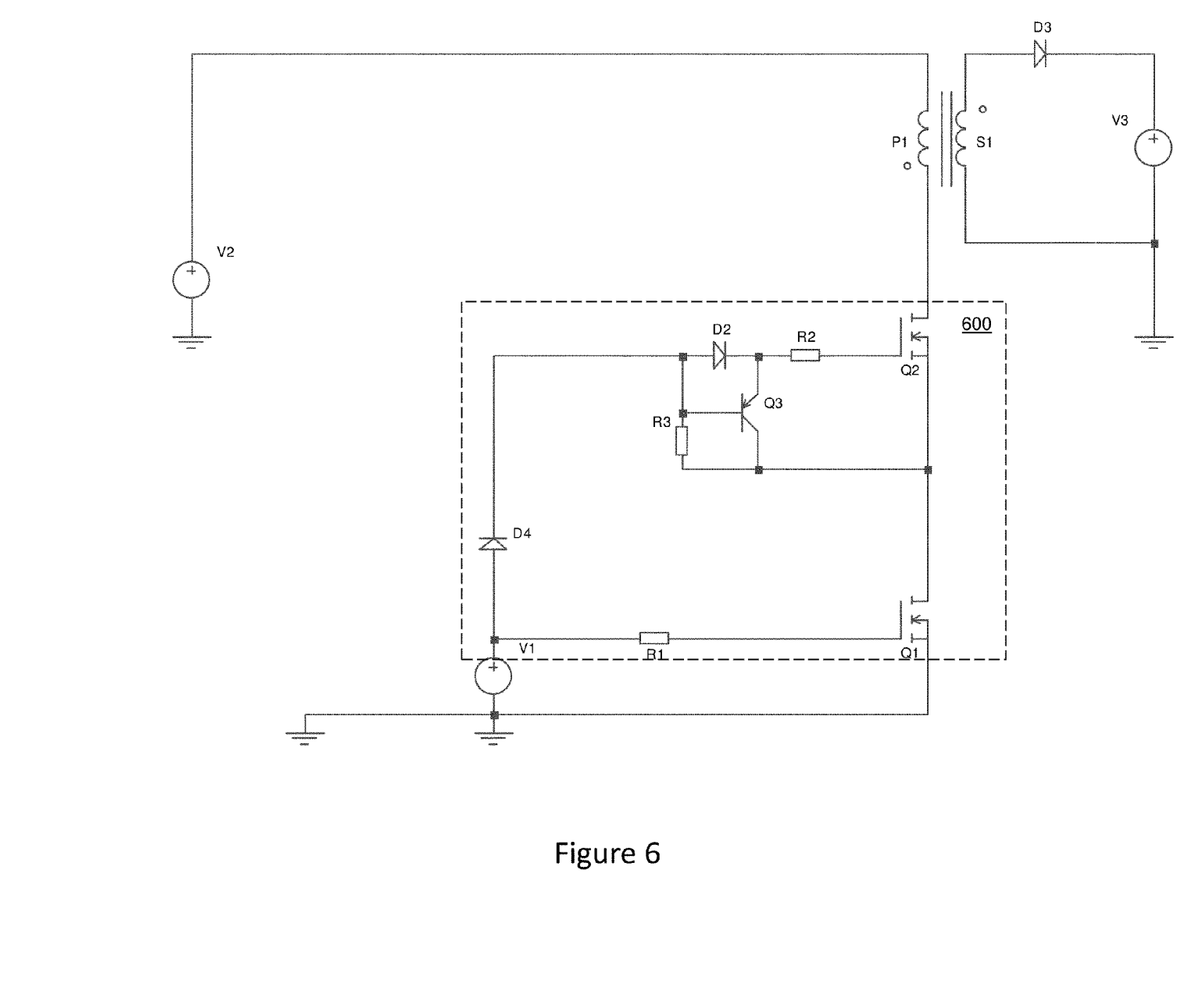
FIG. 6 illustrates a block diagram of a circuit including a load, a cascode switch coupled to the load and a bipolar transistor for actively turning off a high-side transistor of the cascode switch independent of load current.

FIG. 6 illustrates another embodiment of a cascode switch 600 which is similar to the embodiment shown in FIG. 3, however an additional device is provided which is coupled to the gate of the high-side MOSFET Q2 and actively turns off the high-side MOSFET Q2 independent of load current. According to this embodiment, the device is a bipolar junction transistor (BJT) Q3 having a base coupled to a node between the cathode of rectifier diode D4 and the anode of rectifier diode D2, an emitter coupled to the gate of the high-side MOSFET Q2 at a node between the cathode of rectifier diode D2 and resistor R2 and a collector coupled to a node between the series connection of the high-side and low-side MOSFETs Q1 and Q2. A resistor R3 is coupled between the base and collector of BJT Q3.

During turn on of the cascode switch 600, pulse source V1 turns on the low-side MOSFET Q1 and rectifier diodes D2 and D4 begin to conduct and charge the input capacitance of the high-side MOSFET Q2 through resistor R2. The high-side MOSFET Q2 turns on in response. BJT Q3 is off because the base-emitter voltage (Vbe) of Q3 is negative.

During turn off of the cascode switch 600, pulse source V1 turns off the low-side MOSFET Q1 and Vds of Q1 begins to rise. This in turn causes diodes D2 and D4 to become reverse biased and BJT transistor Q3 to conduct and discharge Cgs of the high-side MOSFET Q2, turning off Q2. The voltage on both MOSFETs Q1 and Q2 rises simultaneously. The turn off time of the high-side MOSFET Q2 does not depend on the load current according to this embodiment, meaning that there may still be a slight dependence of the turn off time on load current e.g. as in the case of a single MOSFET. The circuit topology does not result in any additional dependency of turn off time on load current.

Figure 7:
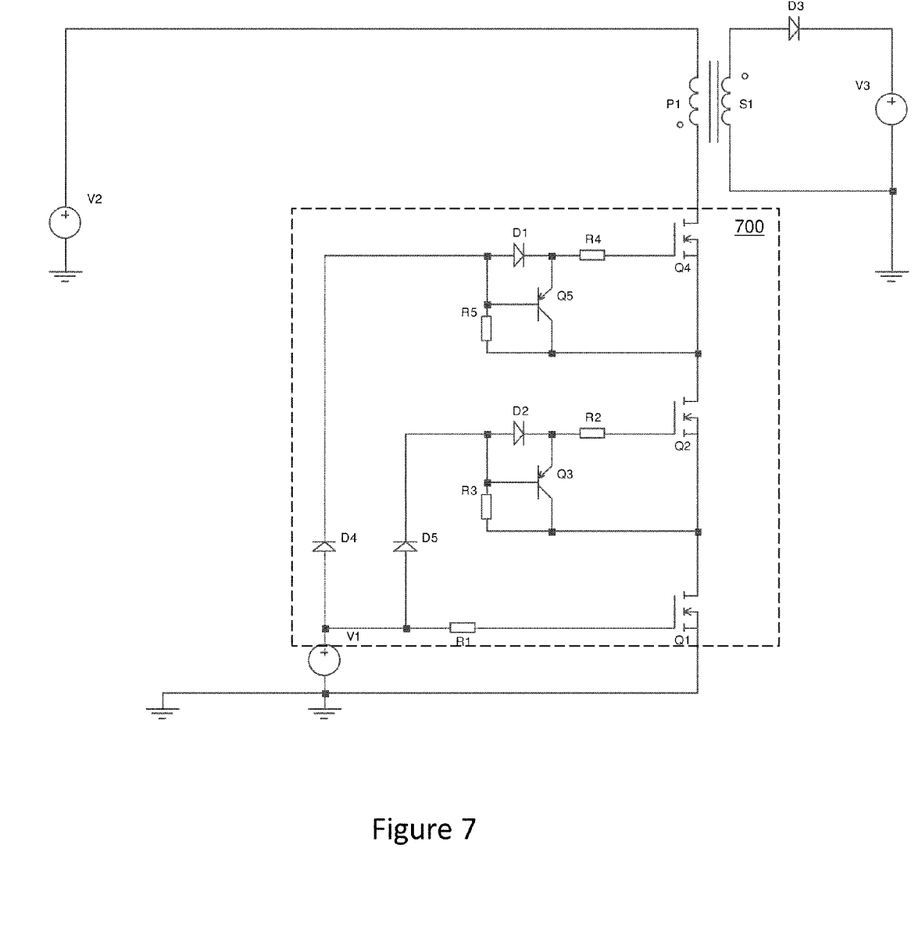
FIG. 7 illustrates a block diagram of a circuit including a load, a cascode switch coupled to the load and bipolar transistors for actively turning off multiple power transistors of the cascode switch independent of load current.

FIG. 7 illustrates an embodiment of a cascode switch 700 which is similar to the embodiment shown in FIG. 6, however an additional power transistor Q4 is coupled in series with the first and second power transistors Q1 and Q2 so that a voltage applied to the load is distributed across all of the series connected power transistors. An additional BJT Q5 is also provided in the same configuration as BJT Q3 for actively turning off power transistor Q4 independent of the load current. In more detail, BJT Q5 has a base coupled to a node between the cathode of rectifier diode D4 and the anode of rectifier diode D1, an emitter coupled to the gate of power transistor Q4 at a node between the cathode of rectifier diode D1 and resistor R4 and a collector coupled to a node between the series connection of power transistors Q4 and Q2. Resistor R5 is coupled between the base and collector of BJT Q5.

During turn on of the cascode switch 700, pulse source V1 turns on MOSFET Q1 and rectifier diodes D5 and D2 begin to conduct and charge the input capacitance of power transistor Q2 through resistor R2. Transistor Q2 turns on in response. BJT transistor Q3 is off because the Vbe of Q3 is negative. Rectifier diodes D4 and D1 also begin to conduct and charge the input capacitance of power transistor Q4 through resistor R4, and Q4 turns on in response. BJT transistor Q5 is also off because the Vbe of Q5 is negative.

During turn off of the cascode switch 700, pulse source V1 turns off MOSFET Q1 and Vds of Q1 starts to rise. This in turn causes rectifier diodes D2 and D5 to become reverse biased, and BJT transistor Q3 to conduct and discharge the Cgs of MOSFET Q2. Transistor Q2 turns off in response. Similarly, rectifier diodes D1 and D4 become reverse biased and BJT transistor Q5 conducts and discharges the Cgs of MOSFET Q4, and Q4 turns off. The voltage rises on all three MOSFETs Q1, Q2 and Q4 simultaneously. As with the embodiment illustrated in FIG. 6 the turn off time of MOSFETs Q1, Q2 and Q4 does not depend on load current according to this embodiment, meaning that there may still be a slight dependence of the turn off time on load current e.g. like for a single MOSFET. Also, the circuit topology does not result in any additional dependency of turn off time on load current.

During turn off and because of component tolerances, one of the power transistors included in a cascode switch can achieve maximum voltage before the other one(s). This transistor enters avalanche mode until the other power transistor turns off. The duration of avalanche is very small e.g. less than 20 ns, and avalanche energy dissipated on the power transistor is typically well below the avalanche energy of the transistor. However if the power transistor does not have avalanche capability, a voltage limiter can be introduced.

Figure 8:
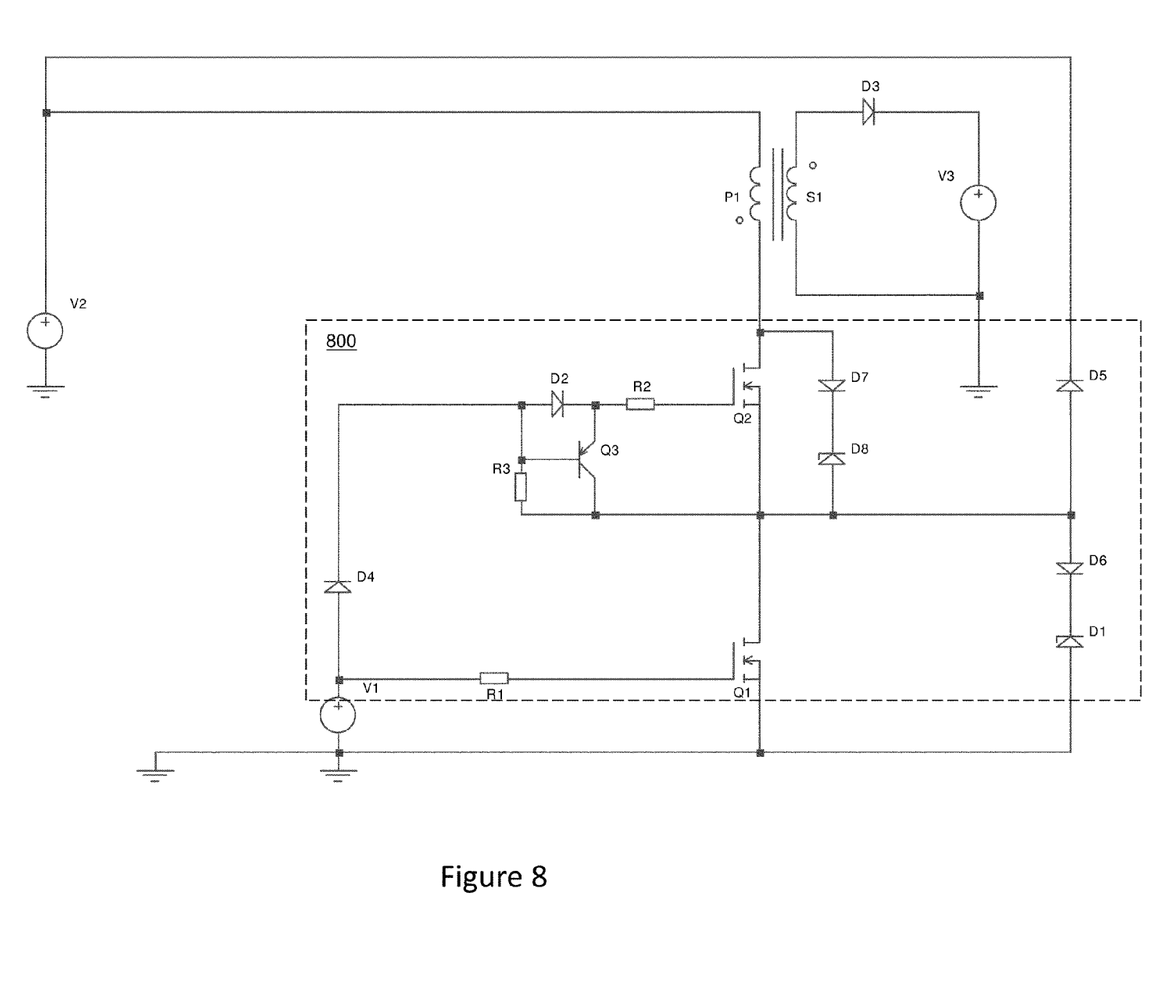
FIG. 8 illustrates a block diagram of a circuit including a load, a cascode switch coupled to the load and voltage limiting circuitry for the cascode switch.

FIG. 8 illustrates an embodiment of a cascode switch 800 which is similar to the embodiment shown in FIG. 6, with the addition of voltage limiter circuitry. According to one embodiment, a first voltage limiter includes rectifier diode D6 and TVS diode D1 connected in parallel with MOSFET Q1. A second voltage limiter includes rectifier diode D7 and TVS diode D8 connected in parallel with MOSFET Q2. TVS diodes D1 and D8 function as high voltage Zener diodes to protect MOSFET Q1 and Q2, respectively. The first and second voltage limiters protect MOSFETs Q1 and Q2 by preventing or at least minimizing avalanche conditions. According to another embodiment, rectifier diode D5 is provided instead of diodes D6, D1, D7 and D8. Rectifier diode D5 has a cathode coupled to the load source V2 and an anode coupled to the source of low-side MOSFET Q1, and protects Q1 from avalanche conditions. In this case, the low-side MOSFET Q1 sustains the input voltage and the high-side MOSFET Q2 sustains the transformer reflected voltage and spikes caused by leakage inductance.

Further enhancements can be made to the cascode switches previously described herein. For example, lossless switching may be provided by ensuring the transformer reflected voltage is equal to the load input voltage and the cascode switch is turned on when the voltage equals or is close to zero.

Figure 9:
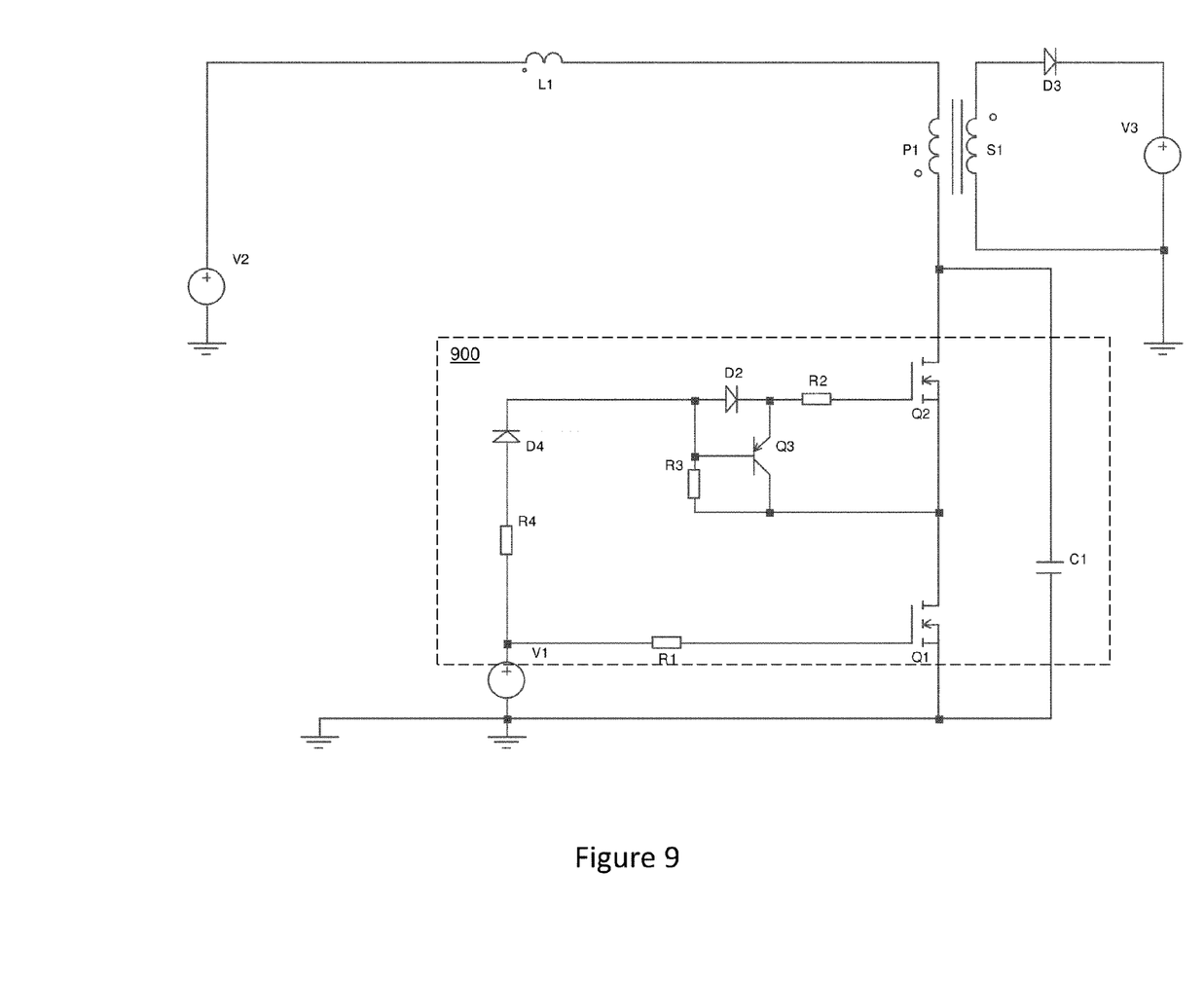
FIG. 9 illustrates a block diagram of a circuit including a load and a cascode switch coupled to the load and having lossless switching.

FIG. 9 illustrates an embodiment of a cascode switch 900 which is similar to the embodiment shown in FIG. 6. Compared to FIG. 6, the cascode switch 900 shown in FIG. 9 has an additional capacitor C1 coupled in parallel with the series connected power MOSFETs Q1 and Q2 and a resistor R4 which couples pulse voltage source V1 to the anode of rectifier diode D4. Resistor R4 enables asymmetric switching of the cascode switch 900 i.e. different turn on and off periods. When MOSFETs Q1 and Q2 turn off, current moves from MOSFETs Q1 and Q2 to capacitor C1. The load current charges capacitor C1, and there are no losses on the cascode switch 900 because capacitor C1 is charged by the load current until the voltage reaches a certain value, when secondary diode D3 begins to conduct. When all energy from the transformer (P1/S1) is released to the secondary winding S1, diode D3 stops conducting and begins to oscillate between the switch capacitance (MOSFETs+C1) and the transformer inductance. When the voltage on the cascode switch 900 reaches zero, the switch 900 turns on and the turn off energy stored in capacitor C1 discharges to the load input source V2.

Figure 10:
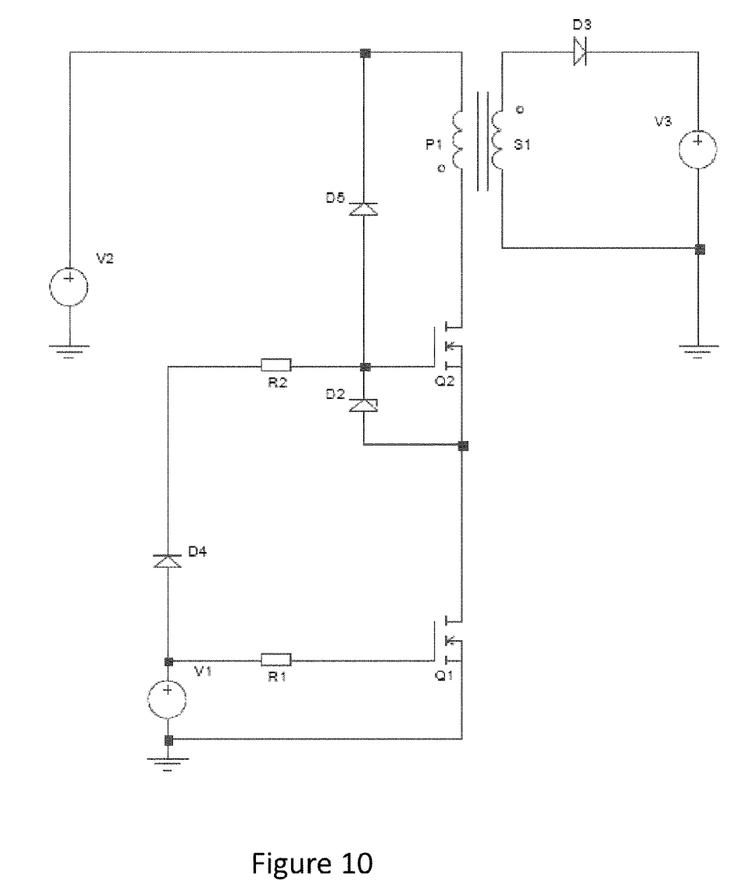
FIG. 10 illustrates a block diagram of a half bridge flyback circuit.

FIG. 10 illustrates an embodiment of a half bridge fly back circuit which is similar to the embodiment shown in FIG. 3, however diode D5 is connected between the gate of the high-side switch Q2 and the terminal of the primary winding P1 connected to the input source V2. According to this embodiment, diode D5 forms a current circulation loop with the primary winding P1 and the high-side switch Q2 during switching off of the high-side switch Q2.

In more detail, the high-side switch Q2 has a source, a gate connected to pulsed drive source V1 through resistor R2 and diode D4, and a drain connected to a second terminal of the primary winding P1. The low-side switch Q1 has a source connected to ground, a gate connected to pulsed drive source V1 through resistor R1 and a drain connected to the source of the high-side switch Q2. The anode of diode D5 is connected to the gate of the high-side switch Q2 and the cathode of diode D5 is connected to the input terminal of the primary winding P1.

Diode D5, the primary winding P1 and the high-side switch Q2 form a current loop when the low-side switch Q1 is turned off and the high-side switch Q2 is in the process of turning off. The current circulated in this loop is transferred to the secondary winding S1 of the transformer after the high-side switch Q2 is switched off, conserving energy and increasing efficiency of the circuit. To this end, the anode of diode D3 is connected to a terminal of the secondary winding S1 and the cathode of diode D3 is connected to the load. The load is represented by voltage V3 in FIG. 10. Diode D5 transfers current from the loop to the secondary winding S1 via the magnetic field in the transformer when the primary winding P1 is disconnected after the high-side switch is turned off and diode D3 is forward biased. Diode D3 becomes forward biased when the high-side switch Q2 turns off. The high-side switch Q2 turns off and diode D3 becomes forward biases when current flowing in the loop discharges the gate-to-source capacitance ($C_{GS}$) of the high-side switch Q2.

Current in the loop formed by diode D5, the primary winding P1 and the high-side switch Q2 goes through the gate-to-source capacitance $C_{GS}$ of the high-side switch Q2. The current loop is formed when diode D5 is forward biased and the high-side switch Q2 is turning off. Diode D5 forward biases when the drain-to-source voltage ($V_{DS}$) of the high-side switch Q2 rises above a voltage level at the half bridge input (V2). The drain-to-source voltage $V_{DS}$ of the high-side switch Q2 rises above the voltage level at the input a period of time after the low-side switch Q1 begins to turn off. Low-side switch Q1 begins to turn off when pulsed source V1 deactivates. This in turn causes the drain-to-source voltage $V_{DS}$ of the low-side switch Q1 to begin rising. When Vds of the low-side switch Q1 reaches the input voltage V2, diode D5 begins to conduct and load current shifts from the low-side switch Q1 to diode D5. Energy is preserved in the current loop formed by diode D5, the primary winding P1 and the high-side switch Q2 when diode D5 is conducting and $C_{GS}$ of the high-side switch Q2 is discharging.

Voltage limiter diode D2 maintains the current loop after $C_{GS}$ of the high-side switch Q2 is fully discharged and Q2 turns off. Turn off of the high-side switch Q2 depends on the load current according to this embodiment. When the gate-to-source voltage ($V_{GS}$) of the high-side switch Q2 reaches the forward voltage of voltage limiter diode D2, current shifts from Cgs of the high-side switch Q2 to diode D2. Current flows through voltage limiter diode D2 until the high-side switch Q2 completely turns off. When high-side switch Q2 turns off, the drain-to-source voltage ($V_{DS}$) of Q2 rises until the voltage on the secondary winding S1 becomes equal to V3 and diode D3 begins to conduct, transferring energy from the primary side of the transformer to the secondary side.

Figure 11:
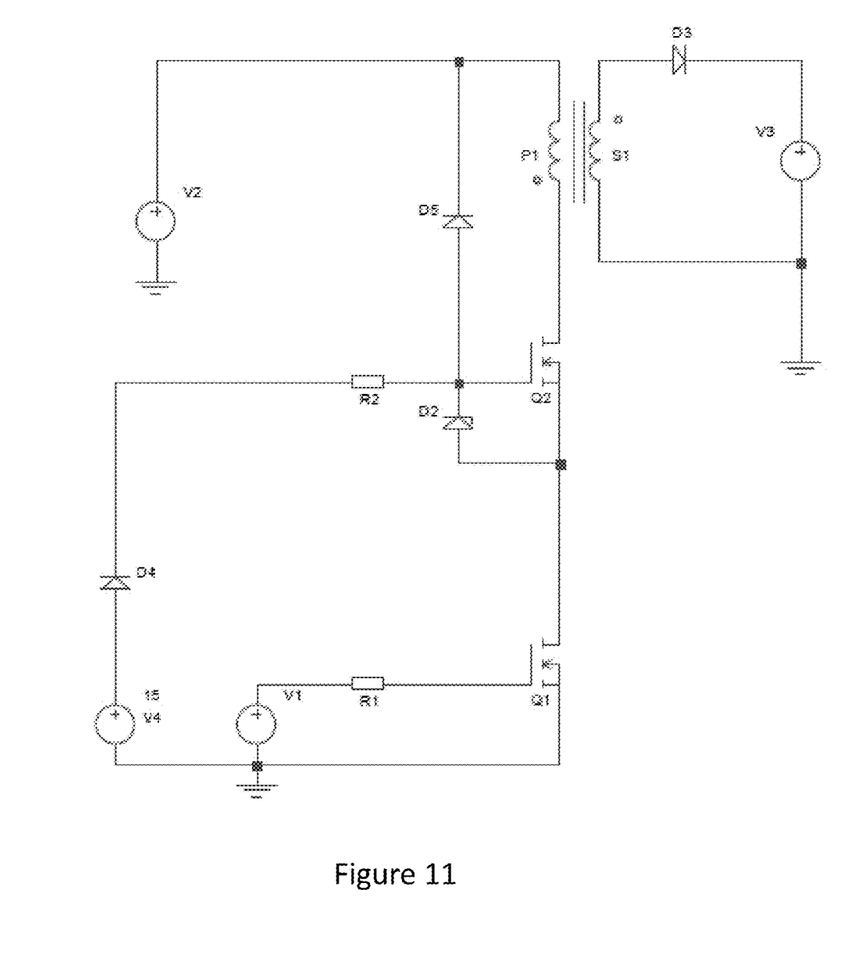
FIG. 11 illustrates a block diagram of a half bridge flyback circuit according to another embodiment.

FIG. 11 illustrates an embodiment of a half bridge fly back circuit which is similar to the embodiment shown in FIG. 10, however the gate of the high-side switch Q2 and the gate of the low-side switch Q1 are connected to different drive sources. In the embodiment shown in FIG. 10, both switch gates are connected to the same pulsed voltage drive source V1. Particularly, the high-side switch Q2 is connected to the pulsed voltage drive source V1 through resistor R2 and diode D4 and the low-side switch Q1 is connected to the pulsed voltage drive source V1 through resistor R1. This way, the gates of both switches Q1, Q2 are externally accessible through the same pin i.e. the pin provided for the pulsed voltage drive source V1.

In contrast, FIG. 11 shows the gate of the high-side switch Q2 and the gate of the low-side switch Q1 connected to different drive sources. Particularly, the gate of the high-side switch Q2 is connected to a DC voltage drive source V4 through resistor R2 and diode D4. The DC voltage drive source V4 can be an internal $V_{CC}$ supply for the circuit, and therefore the gate of the high-side switch Q2 is not externally accessible. The gate of the low-side switch is connected to the pulsed voltage drive source V1 through resistor R1. The pulsed voltage source V1 is an external source for which a pin is provided, and therefore the gate of the low-side switch Q1 is externally accessible through this pin. For example, the low-side switch Q1 may be fabricated on a separate semiconductor die than the high-side switch Q2. In this case, the gate of the low-side switch Q1 is externally accessible via the pin used for the pulsed voltage drive source input. The gate of the high-side switch Q2 is powered by an internal DC supply voltage V4 according to this embodiment, and therefore not externally accessible via a pin.

Figure 12:
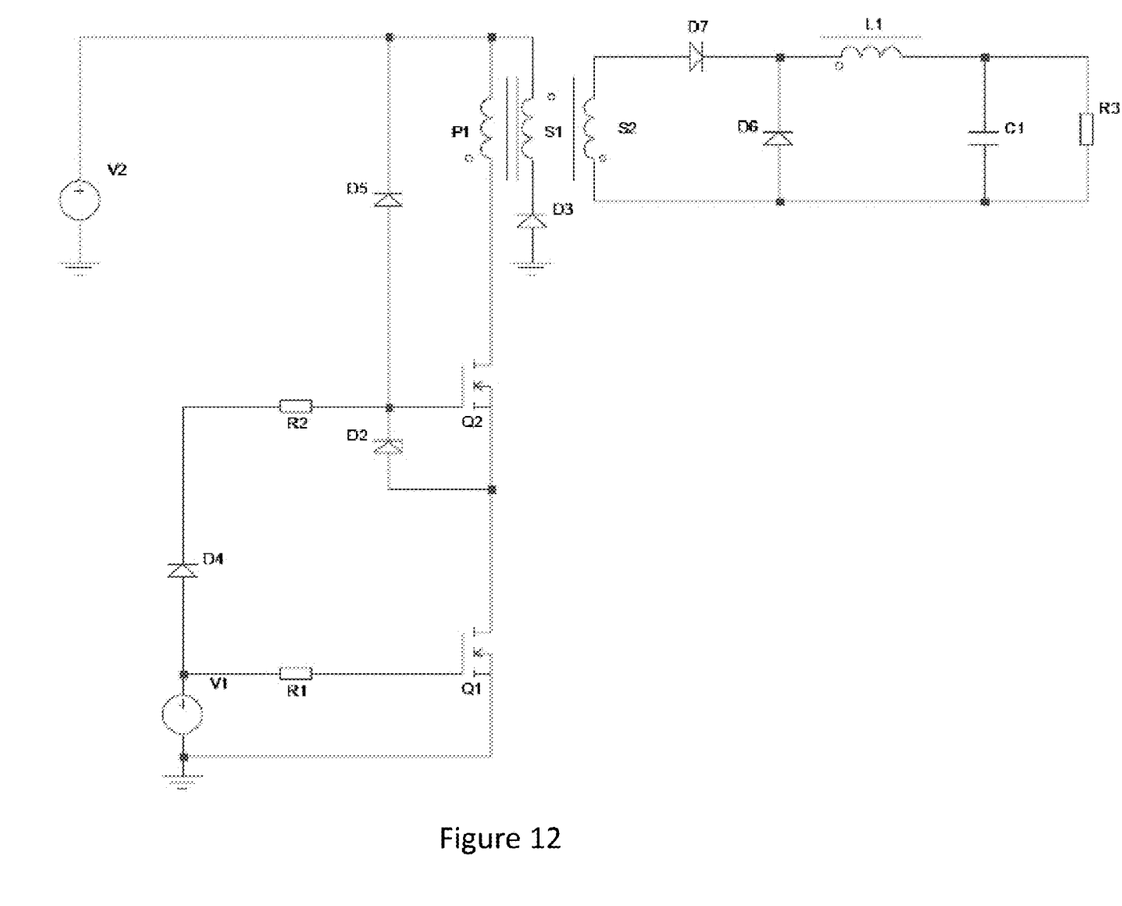
FIG. 12 illustrates a block diagram of a half bridge forward converter circuit.

FIG. 12 illustrates an embodiment of a half bridge forward converter circuit. The half bridge forward converter passes energy directly to the output of the forward converter by transformer action during the switch conduction phase. During turn on of the half bridge switch i.e. Q1 and Q2 are conducting, there are two parallel processes. In one process, diode D7 is directly biased (conducting) and current goes from input voltage source V2 through the transformer (primary P1 and secondary S2 are active) and inductor L1 to the load which is represented by the parallel combination of resistor R3 and capacitor C1. In the second process, the primary side of the transformer is exposed to the input voltage source V2. During the turn on period, magnetizing current rises from zero to a value Im.

During turn off when Q1 and Q2 turn off, the following processes occur. The pulse source output goes to zero, causing the low-side switch Q1 to turn off. This in turn causes the drain-to-source voltage ($V_{DS}$) of Q1 to rise. When $V_{DS}$ of Q1 achieves a particular level of the input voltage input, current divides into two parts: a load current path (going through L1) and a magnetizing current path (going through D5).

In the load current path, diode D7 becomes reverse biased and eventually turns off. This in turn causes diode D6 to begin conducting and continues to carry inductor L1 current. In the magnetizing current path, diode D5 begins to conduct and magnetizing current discharges the gate-to-source capacitance ($C_{GS}$) of the high-side switch Q2, turning off Q2. When the high-side switch Q2 is off, voltage rises to the level of input voltage V2 (e.g. if the number of turns for P1 and S1 are the same, or V2*Ns1/Np1), then diode D3 begins to conduct returning magnetizing current back to the input voltage source V2.

Figure 13:
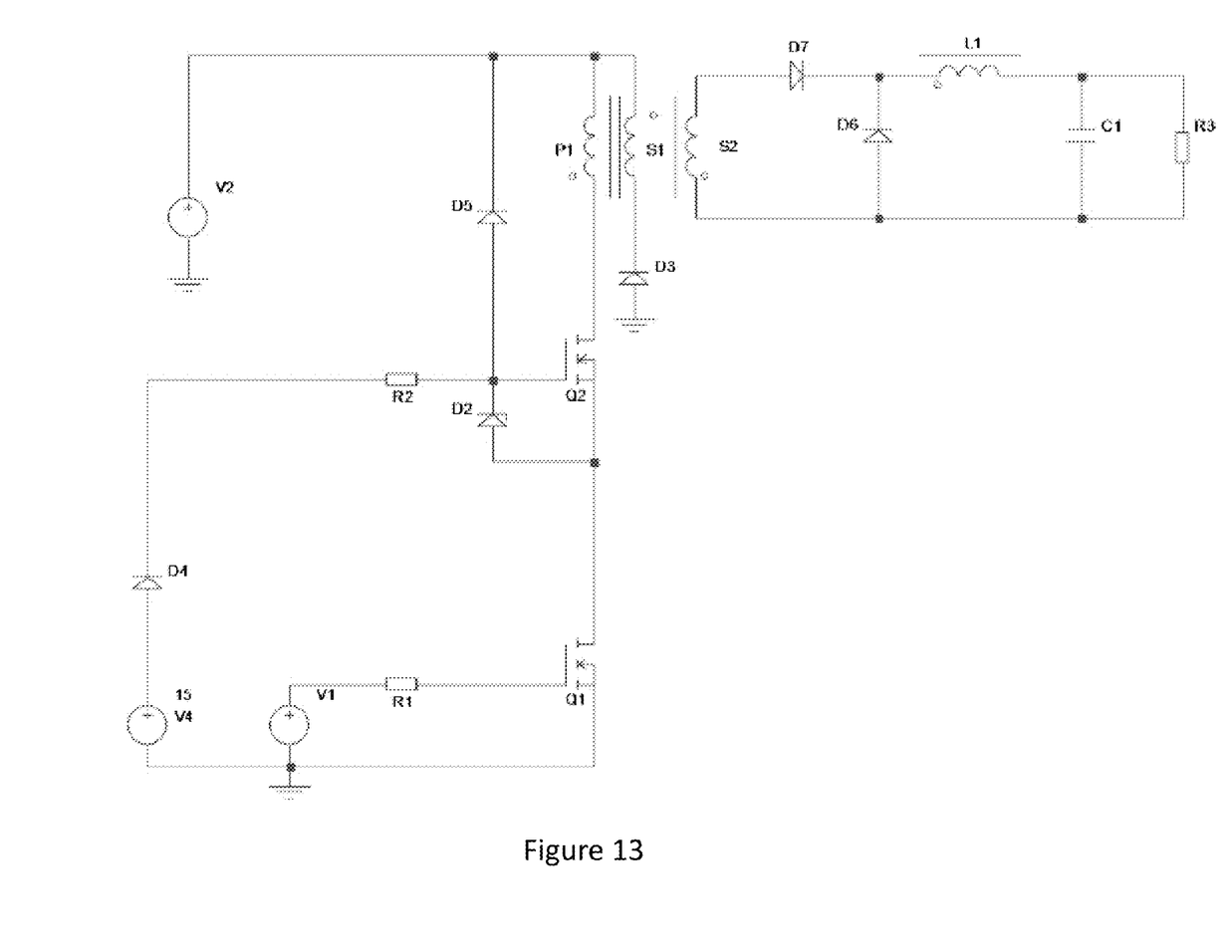
FIG. 13 illustrates a block diagram of a half bridge forward converter circuit according to another embodiment.

FIG. 13 illustrates an embodiment of a half bridge forward converter circuit which is similar to the embodiment shown in FIG. 12, however the gate of the high-side switch Q2 and the gate of the low-side switch Q1 are connected to different drive sources V4, V1 as previously described herein e.g. with reference to FIG. 11.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit, comprising:
   a transformer having a primary winding and a secondary winding;
   an input connected to a first terminal of the primary winding;
   a high-side switch having a source, a gate connected to a drive source and a drain connected to a second terminal of the primary winding;
   a low-side switch having a source connected to ground, a gate connected to a drive source and a drain connected to the source of the high-side switch; and
   a diode connected between the gate of the high-side switch and the first terminal of the primary winding.

2. A circuit according to claim 1, wherein the gate of the high-side switch and the gate of the low-side switch are connected to the same drive source.

3. A circuit according to claim 1, wherein the gate of the high-side switch and the gate of the low-side switch are connected to different drive sources.

4. A circuit according to claim 3, wherein the gate of the high-side switch is connected to a DC voltage drive source and the gate of the low-side switch is connected to a pulsed voltage drive source.

5. A circuit according to claim 1, wherein the diode, the primary winding and the high-side switch are operable to form a current loop when the low-side switch is turned off and the high-side switch is turning off.

6. A circuit according to claim 5, further comprising an additional diode connected between a terminal of the secondary winding and a load, and wherein the diode is operable to transfer current from the loop to the secondary winding via a magnetic field in the transformer when the primary winding is disconnected after the high-side switch is turned off and the additional diode forward biases responsive to the high-side switch being turned off.

7. A circuit according to claim 6, wherein the high-side switch is operable to turn off and the additional diode is operable to forward bias responsive to the current flowing in the loop discharging a gate-to-source capacitance of the high-side switch.

8. A circuit according to claim 1, wherein the diode is operable to forward bias responsive to a drain-to-source voltage of the high-side switch rising above a voltage level at the input, and wherein the drain-to-source voltage of the high-side switch rises above the voltage level at the input a period of time after the low-side switch begins to turn off.

9. A circuit according to claim 1, further comprising an additional diode having an anode connected between the source of the high-side switch and the drain of the low-side switch, and a cathode connected to the gate of the high-side switch.

10. A circuit according to claim 1, further comprising an additional diode and an inductor, wherein the additional diode has an anode connected to a terminal of the secondary winding and a cathode connected to one end of the inductor, and wherein the other end of the inductor is connected to the load.

11. A method of switching a load, comprising:
   driving an input connected to a first terminal of a primary winding of a transformer, the transformer having a secondary winding connected to the load;
   switching on and off a low-side switch having a drain, a source connected to ground, a gate connected to a drive source;
   switching on and off a high-side switch having a drain connected to a second terminal of the primary winding, a source connected to the drain of the low-side switch and a gate connected to a drive source; and
   circulating current in a loop formed by the primary winding, the high-side switch and a diode connected between the gate of the high-side switch and the first terminal of the primary winding when the low-side switch is turned off and the high-side switch is turning off.

12. A method according to claim 11, further comprising transferring current from the loop to the secondary winding via a magnetic field in the transformer when the primary winding is disconnected after the high-side switch is turned off and an additional diode connected between the secondary winding and the load forward biases responsive to the high-side switch turning off.

13. A method according to claim 12, further comprising turning off the high-side switch and forward biasing the additional diode responsive to a gate-to-source capacitance of the high-side switch being discharged by the current flowing in the loop.

14. A method according to claim 11, further comprising forward biasing the diode responsive to a drain-to-source voltage of the high-side switch rising above a voltage level of the input, and wherein the drain-to-source voltage of the high-side switch rises above the voltage level of the input a period of time after the low-side switch begins to turn off.

15. A method according to claim 11, further comprising maintaining the current loop via an additional diode connected between the source of the high-side switch and the gate of the high-side switch responsive to a gate-to-source capacitance of the high-side switch discharging.

16. A method according to claim 11, further comprising connecting the gate of the high-side switch and the gate of the low-side switch to the same drive source.

17. A method according to claim 11, further comprising connecting the gate of the high-side switch and the gate of the low-side switch to different drive sources.

18. A method according to claim 17, further comprising connecting the gate of the high-side switch to a DC voltage drive source and the gate of the low-side switch to a pulsed voltage drive source.

19. A circuit, comprising:
a transformer having a primary winding and a secondary winding;
an input connected to a first terminal of the primary winding;
a high-side switch having a source, a gate connected to a drive source and a drain connected to a second terminal of the primary winding;
a low-side switch having a source connected to ground, a gate connected to a drive source and a drain connected to the source of the high-side switch; and
a diode connected between the gate of the high-side switch and the first terminal of the primary winding, the diode operable to circulate current in a loop with the primary winding and the high-side switch during turning off of the high-side switch and transfer the current to the secondary winding via a magnetic field in the transformer when the primary winding is disconnected after the high-side switch is turned off.

20. A circuit according to claim 19, further comprising an additional diode connected between a first terminal of the secondary winding and a load, and wherein the diode is operable to transfer current from the loop to the secondary winding via the magnetic field in the transformer when the primary winding is disconnected after the high-side switch is turned off and the additional diode forward biases responsive to the high-side switch turning off.

21. A circuit according to claim 20, wherein the high-side switch is operable to turn off and the additional diode is operable to forward bias responsive to the current flowing in the loop discharging a gate-to-source capacitance of the high-side switch.

* * * * *